(12) United States Patent
Tanaka

(10) Patent No.: US 8,142,602 B2
(45) Date of Patent: Mar. 27, 2012

(54) METHOD FOR MOUNTING SEMICONDUCTOR DEVICE

(75) Inventor: Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 236 days.

(21) Appl. No.: 12/474,329

(22) Filed: May 29, 2009

(65) Prior Publication Data

US 2009/0242122 A1  Oct. 1, 2009

Related U.S. Application Data

(63) Continuation of application No. 11/103,942, filed on Apr. 12, 2005, now abandoned.

(30) Foreign Application Priority Data

Apr. 27, 2004 (JP) ................... 2004-130866
Jan. 17, 2005 (JP) ................... 2005-008686

(51) Int. Cl.
 *H01L 21/00* (2006.01)

(52) U.S. Cl. ............... 156/306.6; 438/118; 438/613

(58) Field of Classification Search .......... 156/295, 156/306.6; 438/118, 119, 614; 257/738, 257/778, E21.508
See application file for complete search history.

(56) References Cited

U.S. PATENT DOCUMENTS

| 5,393,697 | A  | 2/1995  | Chang et al.   |
| 5,478,913 | A  | 12/1995 | Boyce et al.   |
| 5,508,228 | A  | 4/1996  | Nolan et al.   |
| 5,578,527 | A  | 11/1996 | Chang et al.   |
| 5,783,465 | A  | 7/1998  | Canning        |
| 5,877,556 | A  | 3/1999  | Jeng et al.    |
| 6,349,872 | B1 | 2/2002  | Yamada et al.  |
| 6,537,854 | B1 | 3/2003  | Chang et al.   |
| 7,098,127 | B2 | 8/2006  | Ito            |
| 2002/0070463 | A1 | 6/2002 | Chang         |
| 2002/0151103 | A1 | 10/2002 | Nakamura et al. |

FOREIGN PATENT DOCUMENTS

| JP | 02-272737   | 11/1990 |
| JP | 03-096921   | 4/1991  |
| JP | 06-302606   | 10/1994 |
| JP | 08-195397   | 7/1996  |
| JP | 2552902     | 8/1996  |
| JP | 11-067776   | 3/1999  |
| JP | 2001-077516 | 3/2001  |
| JP | 2001-110831 | 4/2001  |
| JP | 2002-151533 | 5/2002  |
| JP | 2004-186333 | 7/2004  |

*Primary Examiner* — John Goff
(74) *Attorney, Agent, or Firm* — Harness, Dickey & Pierce, P.L.C.

(57) ABSTRACT

A method of forming a bonded structure comprises the steps of: mounting a semiconductor device having an electrode; a convexity protruding higher than the electrode and formed of a resin; and a conductive unit electrically coupled to the electrode and extending over the surface of the convexity, onto a specific substrate with an intermediary of a bonding material; and mounting the semiconductor device by hot pressing within a temperature range including the glass transition temperature of the resin.

4 Claims, 9 Drawing Sheets

F I G. 1 4
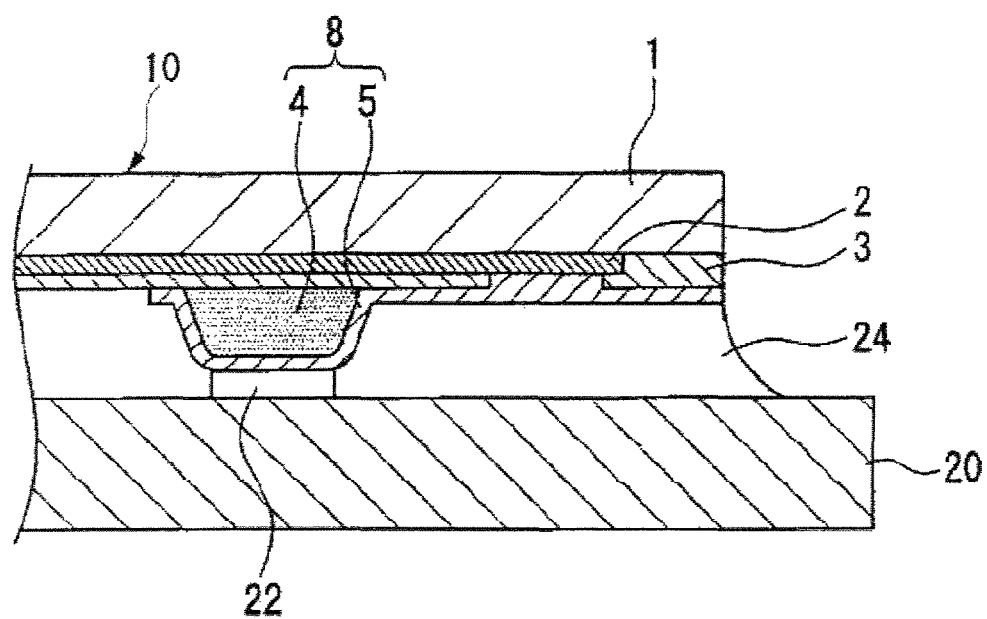

F I G. 1 8
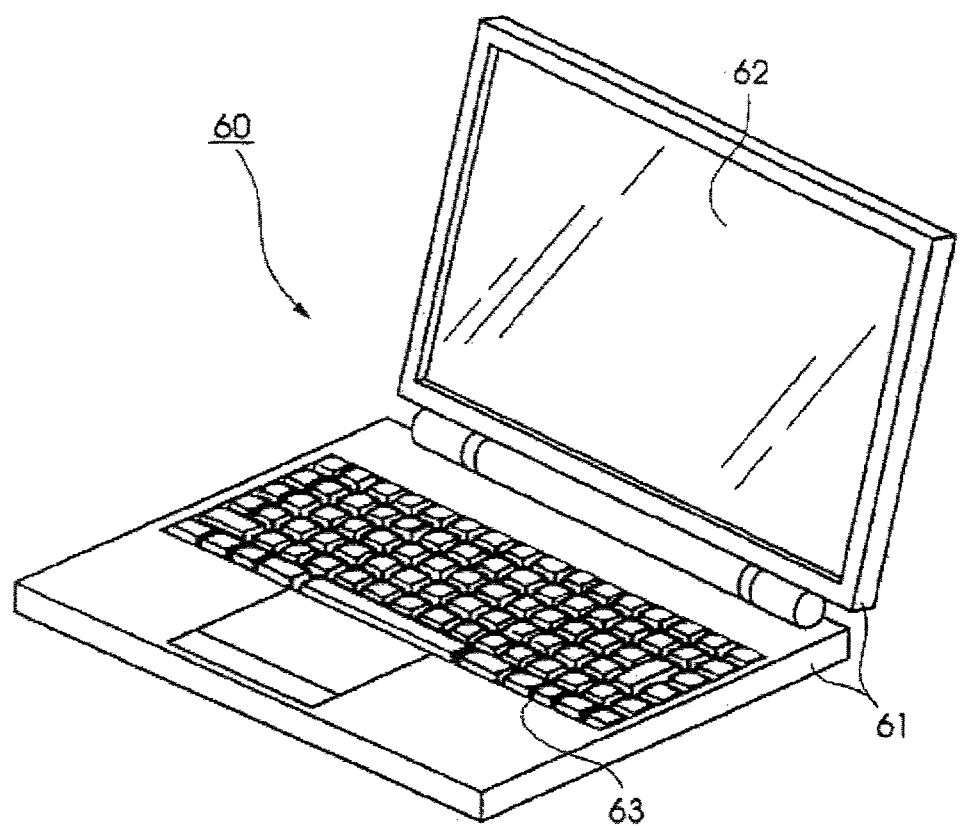

METHOD FOR MOUNTING SEMICONDUCTOR DEVICE

RELATED APPLICATIONS

This application is a continuation of U.S. patent application Ser. No. 11/103,942 filed Apr. 12, 2005, now abandoned. This application claims the benefit of Japanese Patent Application No. 2004-130866 filed Apr. 27, 2004 and 2005-008686 filed Jan. 17, 2005 which are hereby expressly incorporated by reference herein in their entirety.

BACKGROUND

1. Technical Field

The present invention relates to a method of forming a bonded structure, as well as a circuit board, an electro-optic device and an electronic device.

2. Related Art

One conventional coupling method for bonding a driver IC on a substrate of a display device is a known as chip-on-glass (COG) coupling. The COG coupling employs a method wherein, for example, a driver IC is bonded by forming an Au-plated bump on a driver IC and then electrically coupling the bump formed on the driver IC with an electrode terminal formed on a substrate of a display device using a conductive bonding material such as anisotropic conductive film (ACF) and anisotropic conductive paste (ACP) (see Japanese Unexamined Patent Publication Nos. 2-272737 and 3-96921, for example).

However, with the miniaturization (pitch narrowing) of the electrodes of a driver IC, the size of conductive particles contained in the above conductive bonding material such as ACF and ACP is becoming close to the size of the gap between the electrodes described above. This sometimes causes a short circuit between the electrodes of the driver IC. Therefore, it has become difficult to mount a driver IC using a conductive bonding material.

Instead, with the pitch narrowing of electrodes of a driver IC, non-conductive films (NCF), that do not contain conductive particles have been widely used as a substitute for conductive bonding materials such as ACP, ACF and the like. Further, as the bump formed on a driver IC, a resin having a core of polyimide having an excellent heat resistance is used (see Japanese Unexamined Patent Publication No. 6-302606, for example).

However, since a resin protrusion made of polyimide has a high elastic modulus lower than a driver IC bonding temperature (high temperature), the resin does not make a transformation at the time of bonding, which has caused a problem of reduction in coupling reliability. More specifically, in COG bonding, an electrode of a driver IC and an electrode terminal on a substrate of a display device are electrically coupled with each other using NCP. Further, the coupling is fixed and retained. However, as for a resin protrusion made of polyimide configuring an electrode of a driver IC, the resin is hardened and contracted by hot pressing, making the periphery of the resin protrusion top raised. Thus, the center of the resin protrusion top is dented (e.g., recessed) compared to the periphery. Therefore, in COG bonding, NCF stays in the recess on the resin protrusion top, which may cause poor conduction in such a region and eventually a reduction in the coupling reliability of the entire device due to the poor conduction.

Hence, as a solution to the above problem, it is considered that, with the use of a silicon-based resin having a low elastic modulus as a bump, the rise of the periphery of the resin protrusion top due to the transformation of the resin at the time of bonding can be avoided and the coupling reliability between an external electrode of a driver IC and an electrode terminal of a display device can be improved. However, there is another problem in that the typical material type of resin having a lower elastic modulus is generally limited to, for example, silicon.

The present invention has been developed taking the above problems into consideration and aims to provide a method of forming a bonded structure that can improve the coupling reliability between a resin protrusion of a driver IC and an electrode terminal formed on a substrate of a display device, as well as a circuit board, an electro-optic device, and an electronic device.

SUMMARY

In order to solve the above problems, the present invention provides a method of forming a bonded structure comprising the steps of: providing a semiconductor device onto a substrate with an intermediary of a bonding material, the semiconductor device having an electrode, a convexity protruding higher than the electrode and formed of a resin, and a conductive unit electrically coupled to the electrode and spreading (extending) over the surface of the convexity; and forming the bonded structure by hot pressing within a temperature range including the glass transition temperature of the resin.

With such a configuration, wherein hot pressing is conducted within a temperature range including the glass transition temperature of the resin, the elastic modulus of the convexity formed of resin starts to decrease at a temperature for bonding the semiconductor device on the substrate. Thus, an external electrode comprising the convexity of the semiconductor makes a transformation during the hot pressing conducted at the time of bonding, thereby assuring coupling with the electrode terminal on the substrate. As a result, the problem of poor conduction can be solved and the coupling reliability can be improved. Further, the availability of NCP coupling eliminates the need of using a bonding material containing anisotropic conductive particles, which leads to a cost reduction. Also, the manufacturing of a convexity using a resin having a high elastic modulus at a room temperature becomes possible. As a result, the choice of resin materials is widened and therefore cost reduction can be achieved by using an inexpensive resin. Furthermore, by using the above-described resin as a material for the convexity, the elastic modulus of the resin decreases at the time of bonding and therefore bonding at a low load (force) becomes possible. Thus, the formation of a convexity on a region where there is a switching element or the like becomes possible. This means that an electrode can be formed on any region of a semiconductor device whether or not there is a switching element present. Moreover, in the case where the convexity is formed on a region where there is a switching element or the like, the region where a convexity is formed in the conventional technique can be reduced, thereby enabling the overall downsizing of a semiconductor device.

Further, in the method of forming a bonded structure according to the present invention, the temperature of forming a bonded structure is equal to or greater than a temperature at which an elastic modulus of the resin starts to decrease.

With such a configuration, wherein the semiconductor device is bonded on the substrate at a temperature equal to or greater than the temperature at which the elastic modulus of the resin starts to decrease, the resin makes a transformation at the time of hot pressing for bonding the semiconductor device on the substrate. As a result, the coupling between the external electrode comprising the convexity and the conduction unit of the semiconductor device and the electrode of the substrate can be assured, and therefore the coupling reliability can be improved.

Further, in a preferable method of forming a bonded structure according to the present invention, the resin to be used is polyimide and the temperature of forming the bonded structure is 200 degrees Celsius or higher and 260 degrees Celsius or lower (i.e., between 200 and 260 degrees Celsius inclusive).

The bonding temperature is set to 200 degrees Celsius or higher and 260 degrees Celsius or lower because, if the bonding temperature is lower than 200 degrees Celsius, the convexity does not make a transformation when bonding the semiconductor device onto the substrate due to a high elastic modulus of the polyimide convexity, which causes poor conduction between the semiconductor device and the substrate, thereby hindering the improvement of the coupling reliability. On the other hand, if the bonding temperature is greater than 260 degrees Celsius, the bonding material for fixing and retaining the semiconductor device on the substrate is completely hardened before the convexity starts to make a transformation. Therefore, by setting the bonding temperature to 200 degrees Celsius or higher and 260 degrees Celsius or lower, where the convexity starts to make a transformation and the bonding material does not start to be hardened, the external electrode comprising the convexity and conductive unit of the semiconductor device can surely be coupled to the electrode of the substrate, which improves the coupling reliability.

Further, in a preferred method of forming a bonded structure according to the present invention, the resin is acrylic resin or phenolic resin.

With such a configuration, since the glass transition temperature of acrylic resin or phenolic resin is low, the convexity starts to make a transformation before the bonding material starts to be hardened. As a result, the external electrode comprising the electrode and convexity of the semiconductor device can be surely coupled to the electrode of the substrate, which improves the coupling reliability.

Further, a preferred method of forming a bonded structure according to the present invention comprises the steps of: providing a plurality of the electrodes; forming a series of the convexities on the plurality of electrodes that are adjacent to each other; forming the conductive unit on the surface of the convexities corresponding to each of the electrodes; and electrically coupling the conductive unit and the electrode.

With such a configuration, there is no need to independently form the convexities for respective electrodes and the time required for manufacturing can be shortened.

Further, in a preferred method of forming a bonded structure according to the present invention, the step of forming the conductive unit further comprises the steps of: forming a conductive layer by sputtering; and forming the first conductive layer by patterning the conductive layer, the first conductive layer being coupled to the electrode and spreading over the surface of the convexity.

With such a configuration, by patterning the conductive layer formed by sputtering into a specified form, the electrode and the first conductive layer, which is formed on the surface of the convexity, can be coupled electrically. Here, in the present invention, the "conductive layer" means a conductive material that is deposited on the substrate before the conductive unit (the first conductive layer and the second conductive layer) is formed in a specific form by patterning.

Further, in a preferred method of forming a bonded structure according to the present invention, the step of forming the conductive unit further comprises the steps of: forming the second conductive layer on the conductive layer by plating; and forming the first conductive layer by removing part of the conductive layer that is not covered with the second conductive layer.

With such a configuration, the conductive unit that covers from the electrode to the surface of the convexity can be formed in a two-layer structure comprising the first conductive layer and the second conductive layer. Therefore, the film thickness of the conductive unit becomes thicker and the film strength of the conductive unit is enhanced. Thus, the conductive unit is able to follow the transformation of the convexity at the time of hot pressing for bonding, and the breakage, short circuit and the like of the conductive unit can be avoided.

Further, in a preferred method of forming a bonded structure according to the present invention, the bonding material is a non-conductive bonding material.

With such a configuration, a short circuit, occurring at the time of bonding, among the plurality of electrodes that are formed on the semiconductor device can be prevented. As a result, the external electrode comprising the convexity and conductive unit of the semiconductor device can surely be coupled to the electrode of the substrate, which improves the coupling reliability.

Further, the present invention is a circuit board comprising a semiconductor device manufactured by the method of forming a bonded structure With such a configuration, a circuit board having the effect described above can be provided. Furthermore, the present invention is an electro-optic device comprising the above circuit board. With such a configuration, an electro-optic device having the effect described above can be provided. Moreover, the present invention is an electronic device comprising the above electro-optic device. With such a configuration, an electronic device having the effect described above can be provided.

BRIEF DESCRIPTION OF THE DRAWINGS

FIG. 14 is a partial enlargement of a COG liquid crystal display device.

FIG. 18 is an external view of an electronic device according to the present invention.

DETAILED DESCRIPTION

First Embodiment

The first embodiment of the present invention will now be described in detail referring to the accompanying drawings. In addition, in each of the drawings used in the following description, the scale of each layer, member, or the like is changed as a matter of convenience to show such layer, member, or the like in recognizable sizes.

Semiconductor Device

Figure 1A:
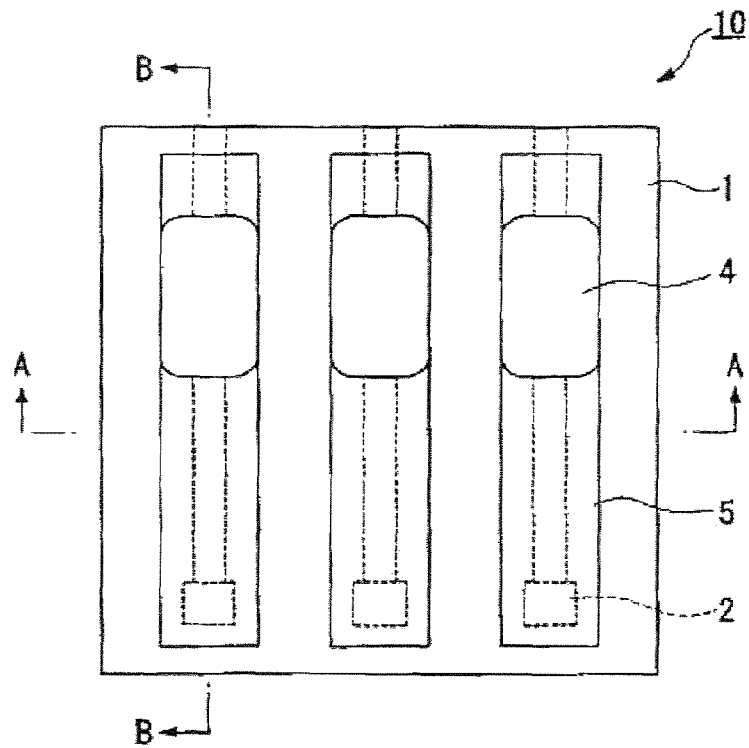
FIG. 1A is a schematic block diagram of a semiconductor device according to the first embodiment.
Figure 1B:
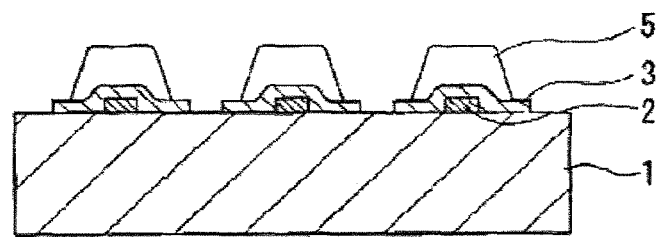
FIG. 1B is a cross-sectional view of the semiconductor device of FIG. 1A along line A-A.
Figure 1C:
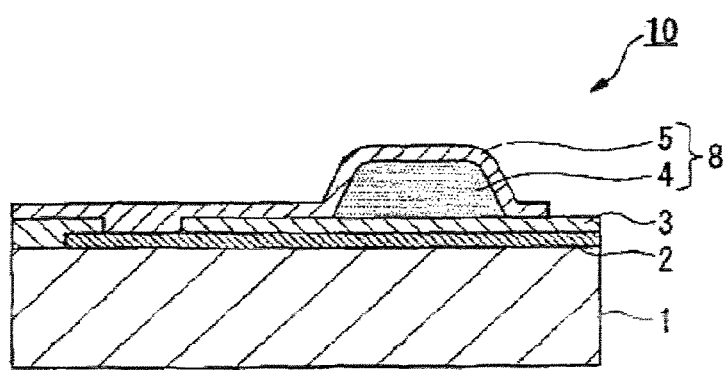
FIG. 1C is a cross-sectional view of the semiconductor device of FIG. 1A along line B-B.

FIG. 1A is a partial enlarged top view of a substrate on which a semiconductor element is formed, showing a semiconductor device according to the present invention. FIG. 1B is a cross-sectional view along line A-A in FIG. 1A. FIG. 1C is another cross-sectional view along line B-B in FIG. 1A. In addition, the substrate in the present embodiment can be either a semiconductor substrate such as a silicon wafer on which a number of semiconductor chips are formed or an independent semiconductor chip. Further, in the case of a semiconductor chip, the shape of the chip is not limited to a general rectangular parallelpiped (including a cube) but can be a sphere. Furthermore, in FIG. 1A, a protective film 3 is omitted for easier understanding of the drawing.

As shown in FIGS. 1A to C, the semiconductor device according to the present embodiment is a substrate 1 (a semiconductor substrate as a semiconductor device) on which a semiconductor element is formed, comprising: an electrode 2 provided for conducting input and output of an electric signal; the protective film 3 (a passivation film) provided for protecting the active surface of the substrate 1; a protrusion 4 (a convexity) made of photosensitive insulating resin and placed at approximately the same pitch as that of the electrode 2; and a first conductive layer 5 formed to cover the electrode 2 and the surface (the top) of the protrusion 4.

The electrode 2 comprises, as shown in FIG. 1C, an electrode pad and wiring coupled to the electrode pad. The wiring is electrically coupled to the semiconductor element bonded on the active surface of the substrate 1, which is described later. The electrode 2 is formed in a plural number at specified pitches near the edges of the substrate 1. In addition, the electrode 2, which is formed of aluminum (Al) in the present embodiment, can have a laminated structure in the order of, other than Al for example, a titan (Ti) layer, a titanium nitride (TiN) layer, an aluminum/copper (AlCu) layer, and a TiN layer (a cap layer). Further, the configuration of the electrode 2 is not limited to the above but can be altered in accordance with required electric, physical, and chemical properties.

The protective film 3, which covers the periphery of the electrode 2 and reveals the electrode pad of the electrode 2 from an opening in the same film, is formed of an insulating film made of silicon oxide ($SiO_2$), silicon nitride (SiN), polyimide resin, and the like. The film thickness of the protective film 3 is approximately 1 μm, for example. Further, the protective film 3 is patterned in a specified shape, a rectangular shape for example, and formed separately from another protective film 3 covering the adjacent electrode 2. Here, the opening for revealing the electrode 2 can be made sufficiently smaller than that provided on the conventional semiconductor device. Specifically, the opening can be a square (or a rectangle) of approximately 5 to 10 μm on a side. Thus, by reducing the size of the opening, an external electrode 8, which is described later, can be formed in a sufficiently large size within a usual region for forming an electrode. Further, in such a case, the size of the electrode 2 can be the same as conventional or smaller in accordance with the size of the opening of the protective film 3. In addition, it is also preferred that the protective film 3 is formed spreading over adjacent electrodes 2.

As shown in FIGS. 1A to C, the protrusion 4 is formed on the surface of the protective film 3 on the active surface of the substrate 1 in the shape of an approximate beheaded pyramid (i.e., truncated). The protrusion 4 is formed to become higher than the electrode 2 by, for example, approximately 10 to 20 μm and has a diameter of approximately 20 to 50 μm when viewed from above. In addition, the protrusion 4 is placed at approximately the same pitch as that of the electrode 2.

Further, the protrusion 4 is made of photosensitive insulating resin, which is specifically acrylic resin. The glass transition temperature of acrylic resin is around 220 degrees Celsius. By adjusting exposure conditions using acrylic resin, the shape of the protrusion 4 becomes controllable. In addition, photosensitive resin materials other than acrylic resin can also be used as the above protrusion 4. For example, the protrusion can be made of phenolic resin, silicon resin, polyimide resin, silicon-modified polyimide resin, or epoxy resin, and the like. The glass transition temperature of such resins varies with resin design: for example, approximately 100 to 200 and several dozen degrees Celsius for phenolic resin and approximately 140 to 200 and several dozen degrees Celsius for epoxy resin.

As shown in FIG. 1C, the first conductive layer 5 is formed continuously covering the protective film 3, including the opening in the protective film 3, spreading over the surface of the protrusion 4, and electrically coupled to the electrode 2. Further, the protrusion 4 and the first conductive layer 5 formed over the surface of the protrusion 4 configure the external electrode 8. Furthermore, the first conductive layer 5 is patterned in a specified shape so as to become the same length as the narrow side of the basal plane of the protrusion 4. As the first conductive layer 5, metals such as Au, TiW, Cu, Cr, Ni, Ti, W, NiV, Al, Pd, Pb-free solder, or the like can be used. In addition, it is preferable that the first conductive layer 5 (in the case of a laminated structure, at least one layer) is formed using a material having a higher corrosion resistance than that of the electrode, such as Cu, TiW and Cr, for example. This is because electrical defects can be prevented by keeping the electrode from corroding.

Method for Manufacturing a Semiconductor Device

Next, a method for manufacturing a semiconductor device according to the present invention and bonding the manufactured semiconductor device on a wiring board will be described in detail referring to the accompanying drawings. FIGS. 2 to 9 are cross-sectional views corresponding to FIG. 1C, that is, cross-sectional views corresponding to the cross-sectional views along the line B-B in FIG. 1A.

Figure 2:
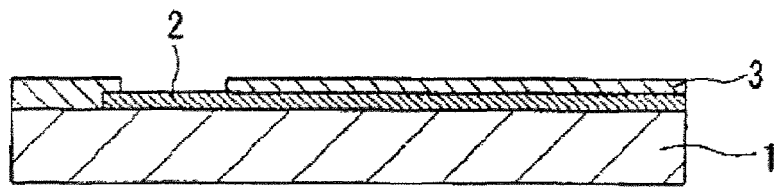
FIG. 2 is a drawing of a manufacturing step of a semiconductor device according to the first embodiment.

First, as shown in FIG. 2, a plurality of electrodes 2 are formed at specified positions on the active surface of the substrate 1. Further, the protective film 3 is formed with the electrodes 2 revealed. The protective film 3 is formed by first depositing silicon oxide ($SiO_2$), silicon nitride (SiN), or the like on the substrate 1 including the electrodes 2. Then, a photoresist layer is formed on the SiO$_2$ by spin coating, dipping, spray coating, or the like, followed by exposure and development (photolithography) conducted using a mask on which a specified pattern is formed. After that, etching is performed to the deposited SiO$_2$ using the photoresist pattern, which is patterned in accordance with the specified shape, as a mask. With such an etching method, the protective film 3 having an opening for revealing the electrode 2 is obtained. Here, it is preferable to employ dry etching. Especially, reactive ion etching (RIE) is suitable. However, wet etching can also be employed. In addition, after forming the opening as described above, the photoresist pattern is removed using a stripper liquid, and the like.

Figure 3:
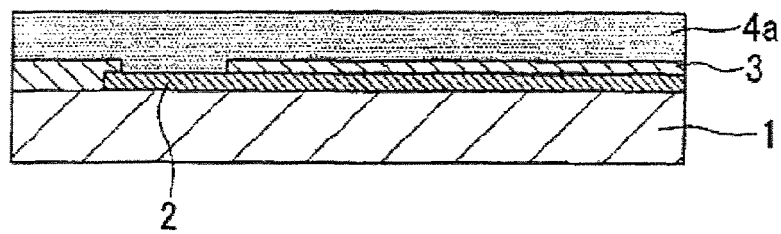
FIG. 3 is a drawing of a manufacturing step of a semiconductor device according to the first embodiment.
Figure 4:
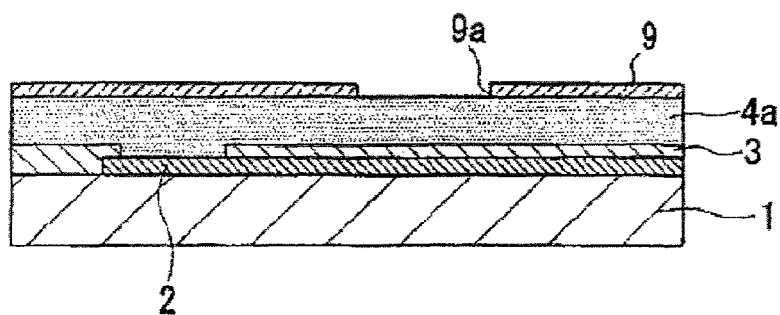
FIG. 4 is a drawing of a manufacturing step of a semiconductor device according to the first embodiment.

Next, as shown in FIG. 3, a resin layer 4a is formed by applying a resin for configuring the protrusion 4, that is, an acrylic resin to become positive photoresist, on the protective film 3 by the thickness of, for example, approximately 10 to 20 μm and further prebaking. Then, as shown in FIG. 4, a mask 9 is positioned at a specified position on the resin layer 4a. The mask 9 to be used is a glass substrate, on which a light shielding film such as Cr, and the like. is formed, and has a round opening 9a placed corresponding to the top-view shape of each hemispherical protrusion 4 to be formed. In addition, the positioning of the mask 9 is conducted so that the opening 9a comes above the point where the protrusion 4 is to be formed.

Next, by applying ultraviolet radiation onto the mask 9, the resin layer 4a revealed from the opening 9a is exposed. However, in the exposure process, the pattern to be formed of the resin layer 4a obtained after development must be a convexity having a curved top surface, which can be achieved by adjusting exposure conditions. Specifically, exposure is conducted at an exposure value sufficiently lower than the standard exposure value for the material and thickness of the resin layer 4a, what is called underexposure. In addition, the actual exposure (underexposure) is conducted at, for example, approximately half the standard exposure value.

Figure 5:
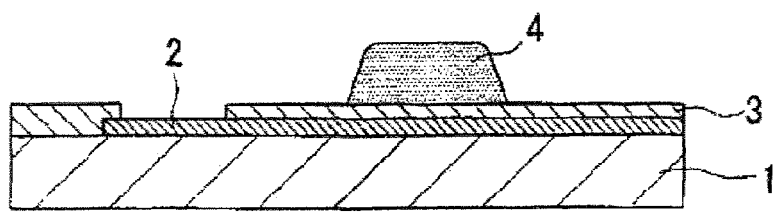
FIG. 5 is a drawing of a manufacturing step of a semiconductor device according to the first embodiment.

When exposure is conducted as described above, the exposure value applied on the resin layer 4a revealed from the opening 9a of the mask 9 gradually becomes smaller going outward from the center of the opening 9a. Therefore, when development is conducted after such an exposure process, an unexposed region created on the resin layer 4a, revealed from the opening 9a, due to a small exposure value is developed and removed. That is, in accordance with the extent of exposure on the surface of the resin layer 4a, which gradually decreases from the center to the periphery of the opening 9a, the unexposed region created by the decrease in the extent of exposure is developed and removed. As a result, as shown in FIG. 5, the resin layer 4a forms a pattern of a convexity having a curved top surface, in other words, the protrusion 4 taking the shape of an approximate beheaded pyramid.

Figure 6:
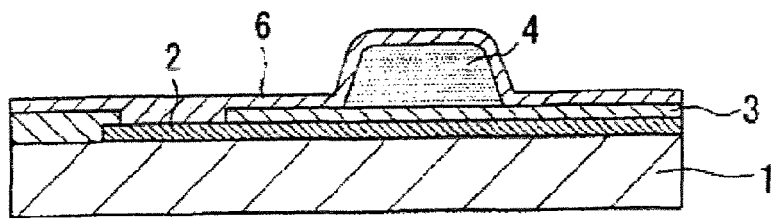
FIG. 6 is a drawing of a manufacturing step of a semiconductor device according to the first embodiment.

After forming the protrusion 4 by removing the unexposed region of the resin layer 4a as described above, a conductive material (which becomes the first conductive layer by patterning) comprising metals such as Au, TiW, Cu, Cr, Ni, Ti, W, NiV, Al, Pd, Pb-free solder, or the like is deposited on the entire surface of the substrate 1, including the electrode 2 formed by being revealed from the opening of the protective film 3 and the protrusion 4, by sputtering, as shown in FIG. 6. The thickness of a conductive material layer 6 (a conductive layer) is approximately 200 nm, for example.

Figure 7:
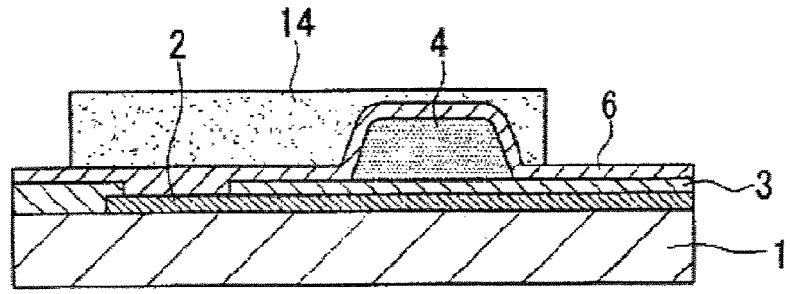
FIG. 7 is a drawing of a manufacturing step of a semiconductor device according to the first embodiment.

Next, a photoresist layer is formed by applying photoresist on the entire surface of the conductive material layer 6 by spin coating, dipping, spray coating, or the like. Then, the photoresist layer is patterned in a specified shape by exposure and development using a mask corresponding to the top-view shape (top-view pattern) of the first conductive layer 5 to be formed. Thus, as shown in FIG. 7, a photoresist pattern 14 is formed corresponding to the pattern shape of the first conductive layer to be formed.

Figure 8:
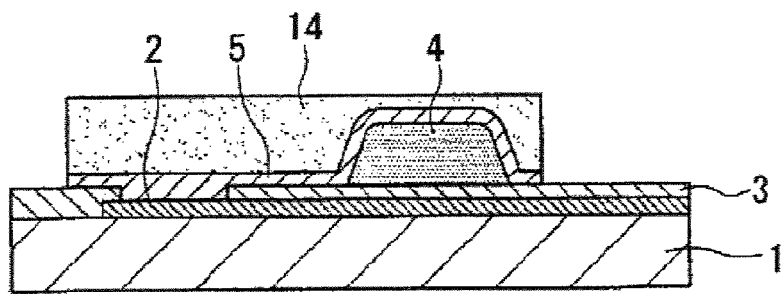
FIG. 8 is a drawing of a manufacturing step of a semiconductor device according to the first embodiment.

Then, the region of the conductive material layer 6 that is not covered with the photoresist pattern 14 is removed by etching. Thus, as shown in FIG. 8, the first conductive layer 5 electrically coupled to the electrode 2 is formed covering the protective film 3 including the opening formed in the protective film 3 and spreading over the protrusion 4. In addition, the etching method employed here can be any method: for example, dry etching using plasma, wet etching using a chemical solution, or the like.

Figure 9:
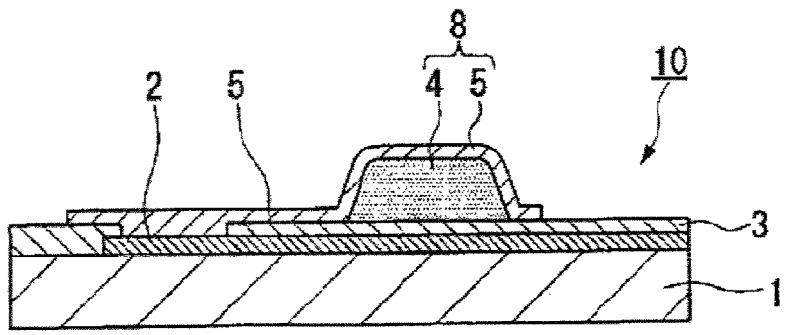
FIG. 9 is a drawing of a manufacturing step of a semiconductor device according to the first embodiment.

Lastly, by removing the photoresist pattern 14 as shown in FIG. 9 and further cutting into pieces by dicing, if needed, a semiconductor device 10 according to the present invention can be obtained.

Second Embodiment

The second embodiment will now be described in detail referring to the accompanying drawings.

In the method for forming a semiconductor device according to the first embodiment, the conductive unit covering from the electrode 2 and spreading over the surface of the protrusion 4 is formed with a single layer of the first conductive layer 5. In contrast, the second embodiment provides a different method wherein the conductive unit covering from the electrode 2 and spreading over the surface of the protrusion 4 is formed with two layers including the first conductive layer 5 and the second conductive layer 7. In addition, the other details of the method for forming a semiconductor device are the same as those of the first embodiment. Therefore, the same reference numerals are used for the components common to both embodiments and detailed description is omitted.

First, employing the manufacturing steps shown in FIGS. 2 to 6 of the first embodiment, an electrode 2, a resin protrusion 4 projecting higher than the electrode 2, and a conductive material layer 6 (a layer to become the first conductive layer in the latter description) that is electrically coupled to the electrode 2 and covers the surface of the protrusion 4 are formed on a substrate 1.

Figure 10:
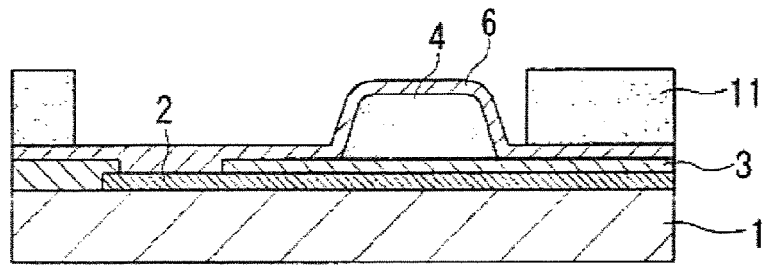
FIG. 10 is a drawing of a manufacturing step of a semiconductor device according to the second embodiment.

Next, as shown in FIG. 10, photoresist is applied on the entire surface of the conductive material layer 6 by spin coating, dipping, spray coating, or the like to form a photoresist layer. Then, the photoresist layer is patterned into a specified shape by exposure and development (photolithography) to the photoresist layer using a mask corresponding to the top-view shape (top-view pattern) of the second conductive layer 7. Thus, as shown in FIG. 10, a photoresist pattern 11 having an opening shape corresponding to that of the second conductive layer 7 to be formed is formed.

Figure 11:
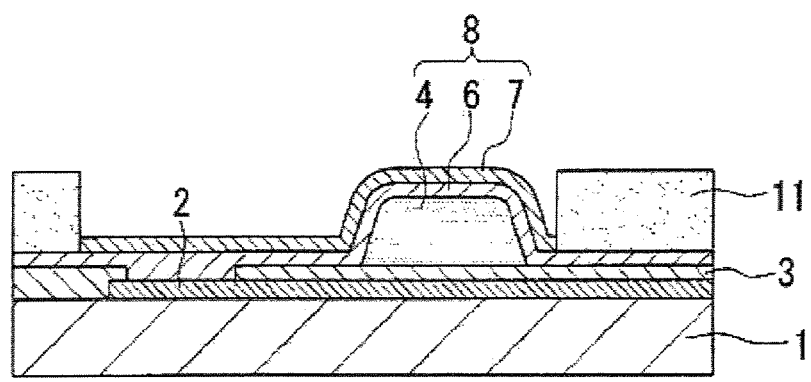
FIG. 11 is a drawing of a manufacturing step of a semiconductor device according to the second embodiment.

Then, as shown in FIG. 11, electrolytic plating is performed using the region of the conductive material layer 6 that is not covered with the photoresist pattern 11, that is, the revealed conductive material layer 6, as a seed layer. A plating layer such as Au, Cu, or the like is deposited on the conductive material layer 6, by electrolytic plating, to form the second conductive layer 7. Here, the film thickness of the second conductive layer 7 must be thicker, 1 to 2 μm for example, than that of the first conductive layer 5. When the film thickness of the second conductive layer 7 is less than 1 μm, the film strength becomes weak and causes wire breakage, or the like because the first conductive layer 5 and the second conductive layer 7 cannot follow the transformation of the protrusion 4 occurring at the time of hot pressing for bonding. On the other hand, when the film thickness of the second conductive layer 7 is over 2 μm, the film strength is enhanced because the layer becomes thicker. However, the time required for plating becomes longer and pitch narrowing becomes difficult.

Figure 12:
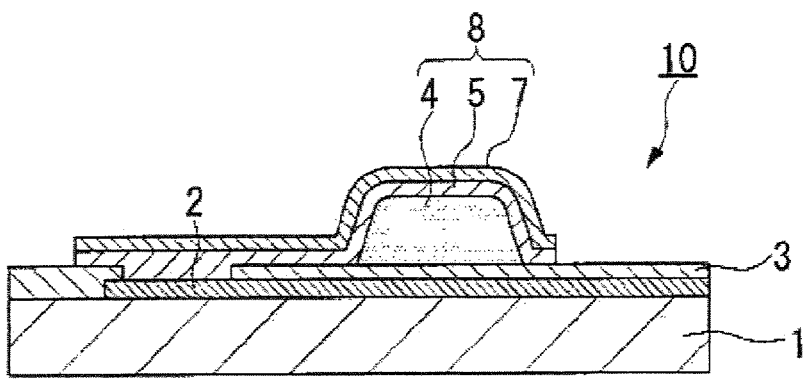
FIG. 12 is a drawing of a manufacturing step of a semiconductor device according to the second embodiment.

Next, as shown in FIG. 12, the photoresist pattern 11 remaining on the conductive material layer 6 is removed. Then, the region of the conductive material layer 6 that is not covered with the second conductive layer 7, that is, the region to become a non-conductive unit, is removed by etching. The etching must be conducted by selectively removing the region of the conductive material layer 6 that is not covered with the second conductive layer 7, using the second conductive layer 7 as a mask. Both methods of dry etching and wet etching are available. Thus, the first conductive layer 5 that is patterned in almost the same shape as the second conductive layer 7 is formed. With such a method, a laminated conductive unit comprising the first conductive layer 5, covering from the electrode 2 and spreading over the top of the protrusion 4, and the second conductive layer 7 are formed. Further, in the present embodiment, an external electrode 8 is formed of the protrusion 4 as well as the first conductive layer 5 and the second conductive layer 7 laminated on the protrusion 4. After the above process, by dicing for cutting into pieces, if needed, a semiconductor device 10 according to the present invention can be obtained.

Electro-Optic Device

Next, a method for manufacturing a liquid crystal display device by mounting the semiconductor device 10, manufactured with the above manufacturing method, onto a wiring board, for example, of a liquid crystal display device (an electro-optic device) will be described in detail referring to the accompanying drawings. As a mounting method to be employed, chip-on-glass (COG) coupling is suitable.

Figure 13:
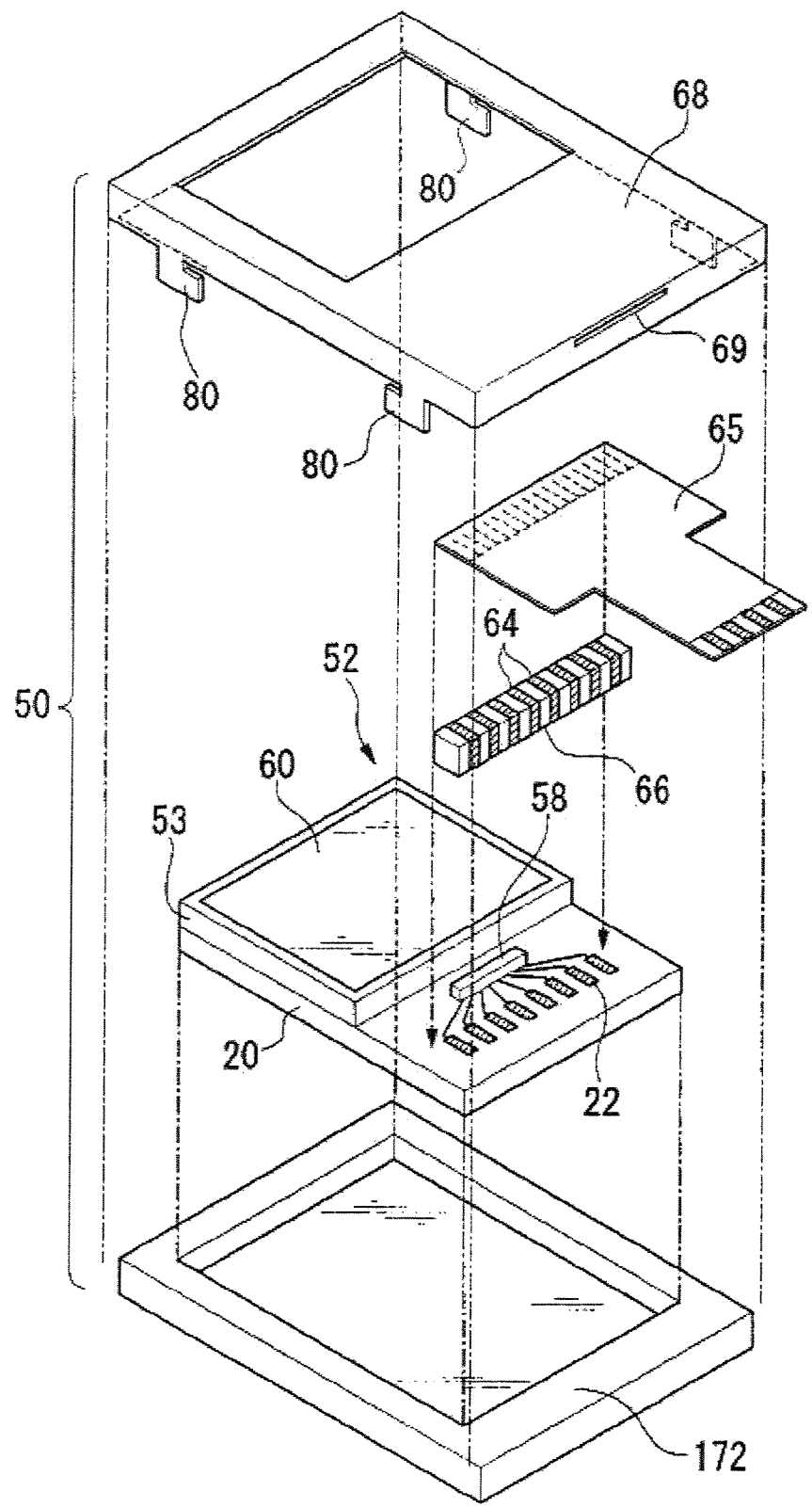
FIG. 13 is an exploded perspective view of a COG liquid crystal display device.

FIG. 13 is an example drawing of a COG liquid crystal display device. As shown in FIG. 13, a liquid crystal display device 50 as an electro-optic device comprises: a frame-shaped shield case 68 formed of a metal plate; a liquid crystal panel 52 as an electro-optic panel; an LSI 58 for driving liquid crystal; an ACF (not illustrated) for electrically coupling the liquid crystal panel 52 and a bump formed on the active surface of the LSI 58 by COG mounting; and a retaining member 172 for retaining the overall device strength.

Further, the liquid crystal panel 52 comprises a wiring board 20 and an opposed board 53 that is placed facing the wiring board 20. On the wiring board 20, which is configured of a glass substrate, or the like, there are a plurality of scanning lines and data lines formed in a matrix; switching elements (not illustrated) coupled to the scanning and data lines; pixel electrodes (not illustrated) coupled to the switching elements; and a plurality of electrode terminals 22 formed corresponding to the arrangement of the plurality of external electrodes 8 of the semiconductor device 10.

FIG. 14 is an enlarged cross-sectional view of the part where the semiconductor device 10 is mounted on the wiring board 20 by COG mounting. First, a bonding material 24 for coupling the external electrode 8 formed on the semiconductor device 10 and the electrode terminal 22 formed on the wiring board 20 is placed on the wiring board 20. The bonding material can be placed on the semiconductor device 10 or on both the semiconductor device 10 and the wiring board 20. Further, in the present embodiment, non-conductive paste (NCP) bonding is employed for coupling the external electrode 8 of the semiconductor device 10 and the electrode terminal 22 of the wiring board 20. Therefore, NCF, which is a dielectric resin, is used as the bonding material 24. The NCF, which contains thermosetting epoxy resin, has a glass transition temperature of around 220 degrees Celsius.

Next, the semiconductor device 10 is bonded on the wiring board 20 on which the NCP bonding material 24 is placed. The semiconductor device 10 is bonded by matching the positions of the external electrode 8 of the semiconductor device 10 and the electrode terminal 22 of the wiring board 20. Then, hot pressing of the semiconductor substrate 1 and the wiring board 20 is conducted within the temperature range of 200 degrees Celsius to 260 degrees Celsius using a flip-chip bonder. The mounting temperature should be set within the above range because, when the mounting temperature is less than 200 degrees Celsius, the elastic force of the resin forming the external electrode 8 of the semiconductor device 10 does not start to decrease and resin transformation does not occur. On the other hand, when the mounting temperature is greater than 260 degrees Celsius, the elastic force of the resin forming the external electrode 8 is low and, before the resin makes a transformation, the NCP bonding material 24 is hardened, leading to poor coupling. Therefore, in the present embodiment, a resin having a glass transition temperature of approximately 220 degrees Celsius, which is within the above mounting temperature range, is used for forming the external electrode 8 of the semiconductor device 10 so that mounting can be conducted while the elastic force of the resin is decreasing.

Figure 15:
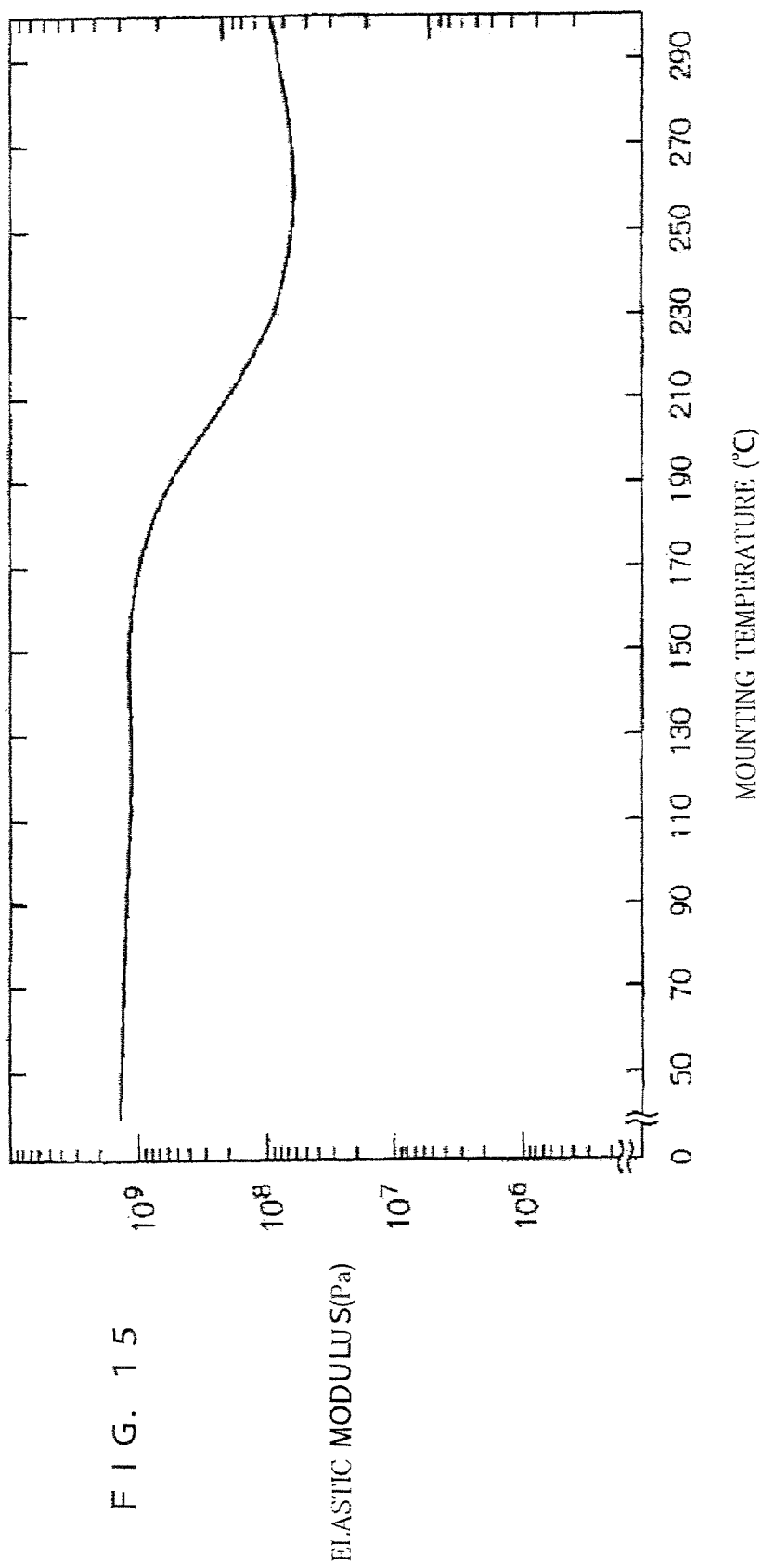
FIG. 15 is a graph of the relation between mounting temperature and acrylic resin elastic modulus.

FIG. 15 is a graph of the relation between elastic modulus and mounting temperature when acrylic resin is used as the resin forming the protrusion 4. The horizontal axis of the graph indicates the transition of mounting temperature (° C.) and the vertical axis indicates the transition of elastic force (Pa) of the resin, which are expressed in a logarithmic form. Further, the temperature measurement starts from 30 degrees Celsius and ends at 300 degrees Celsius. In addition, the heating rate is 4 degrees Celsius/min. As shown in FIG. 15, the elastic modulus of the acrylic resin starts to decrease around the mounting temperature of 170 degrees Celsius. Further, with the rise of the mounting temperature, the elastic modulus of the resin keeps decreasing. Within the mounting temperature range of 200 degrees Celsius to 260 degrees Celsius, the elastic modulus of the resin shows a decrease because the glass transition temperature of the acrylic resin is around approximately 220 degrees Celsius. Therefore, under the pressurization by the flip chip bonder, the protrusion 4 made of acrylic resin starts transformation before the NCP bonding material 24 starts to be hardened, that is, before the mounting temperature reaches 260 degrees Celsius.

Hot pressing is conducted for 5 to 10 seconds, for example, so as to electrically couple the external electrode 8 of the semiconductor device 10 and the electrode terminal 22 of the wiring board 20 by transforming the resin protrusion 4. Then, by hardening the NCP bonding material 24, the coupling is fixed and retained. Thus, as shown in FIGS. 13 and 14, the semiconductor device 10 is bonded on the wiring board 20 by COG.

With such a configuration, wherein hot pressing is conducted within the temperature range including the glass transition temperature of the resin, the elastic modulus of the resin protrusion 4 shows a decrease at a temperature for mounting the semiconductor device 10 on the substrate 1. Therefore, the external electrode 8 comprising the protrusion 4 of the semiconductor device 10 makes a transformation, assuring the coupling between the substrate 1 and the electrode terminal 22. As a result, the problem of poor conduction can be solved and the coupling reliability can be improved. Further, the availability of the NCP coupling method eliminates the need of using a bonding material containing anisotropic conductive particles, which leads to a cost reduction. In addition, manufacturing of the protrusion 4 using a resin having a higher room-temperature elastic modulus becomes possible. As a result, the choice of available resin materials is widened to include less expensive materials, which also leads to a cost reduction. Furthermore, since the elastic modulus of the resin at the time of mounting is reduced by using the resin described above as the protrusion 4, mounting at a lower load becomes possible. With such a method, the protrusion 4 can be formed on a region including a switching element, and the like of the semiconductor device 10. Thus, the protrusion 4 can be formed on any region of the semiconductor device 10 whether or not there is a switching element present. In addition, in the case of forming the protrusion 4 on a region including a switching element, and the like, the region where the protrusion 4 is formed in the conventional technique can be reduced, enabling the miniaturization of semiconductor devices.

Figure 16:
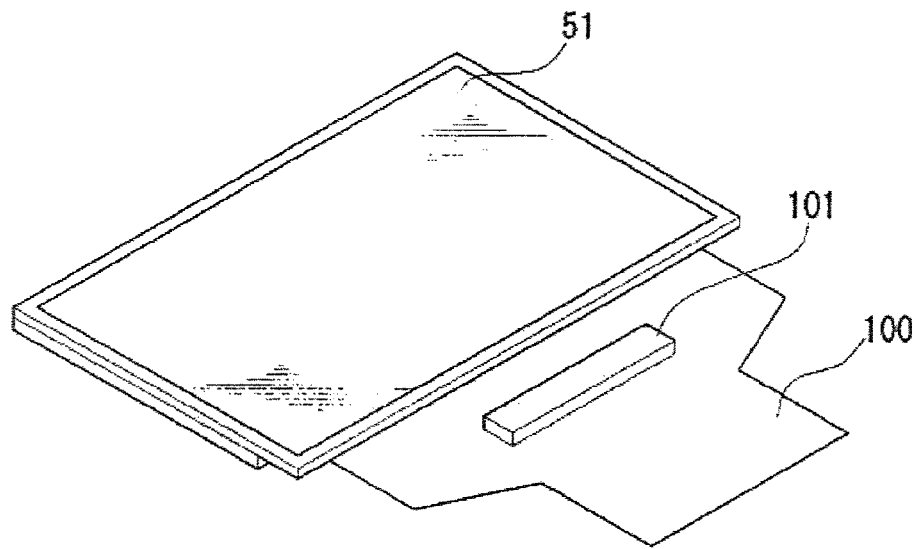
FIG. 16 is a schematic perspective view of the configuration of a COF liquid crystal display device.

FIG. 16 is a perspective view of the schematic configuration of a liquid crystal display device manufactured with a different configuration from that of the liquid crystal display device described above. The liquid crystal display device shown in FIG. 16 comprises a color liquid crystal panel 51 as an electro-optic panel and a chip-on-film (COF) circuit board 100 coupled to the liquid crystal panel 51. The circuit board 100 comprises a semiconductor device 101 manufactured with the above-described method for manufacturing a semiconductor device. In such a configuration, the circuit board 100 is an embodiment of the circuit board according to the present invention, and the liquid crystal display device is an embodiment of the electro-optic device according to the present invention. Further, in the liquid crystal display device, an illumination device such as a backlight, or the like and other related equipment can be added to the liquid crystal panel 51 according to need. Furthermore, the circuit board 100 is not limited to a COF circuit board but can be a chip-on-board (COB) circuit board.

In addition, the present invention can be applied to, other than the COF or COB circuit board, an electro-optic device employing the chip-on-glass (COG) method wherein a driver IC, or the like are directly bonded on a display panel (a liquid crystal panel).

Figure 17:
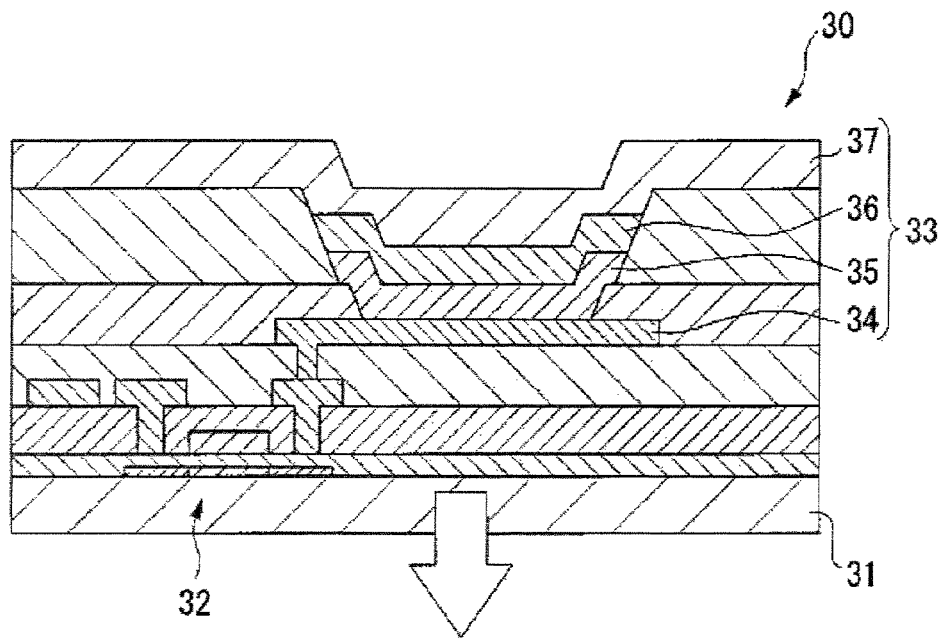
FIG. 17 is a cross-sectional view of an organic EL panel according to the present invention.

Also, the present invention can be applied to electro-optic devices, other than liquid crystal display devices, such as organic EL display devices. FIG. 17 is a cross-sectional view of an organic EL panel provided on an organic EL display device as the electro-optic device according to the present invention. An organic EL panel (an electro-optic panel) 30 is schematically configured by forming a thin film transistor (TFT) 32 to form a matrix and further forming a plurality of laminated bodies 33 on a substrate 31. The TFT 32 comprises a source electrode, a gate electrode, and a drain electrode. The gate electrode and the source electrode are electrically coupled to the external electrode 8 shown in, for example, FIG. 1. The laminated bodies 33 include an anode layer 34, a hole injection layer 35, a luminous layer 36, and a cathode layer 37. The anode layer 34 is coupled to the drain electrode of the TFT 32, wherein an electric current is supplied to the anode layer 34 via the source and drain electrodes of the TFT 32 when the TFT 32 is turned on.

In the organic EL panel 30 having the above configuration, a light generated by reunification, occurring within the luminous layer 36, of a hole injected from the anode layer 34 into the luminous layer 36 via the hole injection layer 35 and an electron injected from the cathode layer 37 into the luminous layer 36 is emitted from the side of the substrate 31.

Next, an electronic device on which the electro-optic device according to the present embodiment is bonded will be described in detail. By incorporating electronic parts such as a mother board, a keyboard, a hard disk, and the like that form the liquid crystal display device as the above-described electro-optic device, a central processing unit (CPU), and the like into a chassis, a notebook personal computer 60 (an electronic device), for example, shown in FIG. 18 can be manufactured.

FIG. 18 is an external view of a notebook computer as an electronic device according to an embodiment of the present invention. In FIG. 18, a reference numeral 61 indicates a chassis, a reference numeral 62 indicates a liquid crystal display device (an electro-optic device), and a reference numeral 63 indicates a keyboard. Further, in FIG. 18 showing a notebook computer having a liquid crystal display device, the liquid crystal display device can be substituted by an organic EL display device.

In addition, the above embodiment is not limited to a notebook computer, which is taken as an example of the electronic device, but can be applicable to electronic devices such as cellular phones, liquid crystal projectors, multimedia-compatible personal computers (PCs) and engineering workstations (EWSs), pagers, word processors, televisions, videotape recorders with a viewfinder or a direct-view monitor, electronic organizers, electronic desk calculators, car navigation devices, POS terminals, devices having a touch panel, and the like.

The present invention is not limited to the above embodiments describing a semiconductor device and a method for manufacturing the same, as well as an electro-optic device and an electronic device, but can be freely varied within the scope of the present invention.

For example, the "semiconductor element" described in one of the above embodiments can be substituted by an "electronic element" to manufacture an electronic part. Electronic parts manufactured using such an electronic element include, for example, optical elements, resistors, condensers, coils, oscillators, filters, temperature sensors, thermistors, varistors, volumes, fuses, and the like.

What is claimed is:
1. A method of forming a mounted structure, comprising the steps of:
    providing a semiconductor device on a substrate with an intermediary of a bonding material, the semiconductor device including:
        an electrode;
        a protective layer on the electrode and having an opening exposing a portion of the electrode;
        a resin convexity protruding higher than the electrode, the resin convexity being laterally spaced apart from the opening of the protective layer; and
        a conductive unit electrically coupled to the electrode and extending over a surface of the resin convexity, the conductive unit continuously covering:
        the opening formed in the protective layer; and
        the resin convexity;
    hot pressing the semiconductor device, substrate and bonding material within a temperature range including a glass transition temperature of the resin and a glass transition temperature of the bonding material, the glass transition temperature of the resin and the bonding material being about 220° C. to mount
    the semiconductor device onto the substrate at a temperature at least equal to a temperature at which an elastic modulus of the resin starts to decrease, the conductive unit being formed to cover the opening formed in the protective layer and spread over the resin convexity in one step.

2. The method of forming a mounted structure according to claim 1, wherein the bonding material is a non-conductive, dielectric film and includes a thermosetting epoxy resin.

3. The method of forming a mounted structure according to claim 1, wherein the conductive unit is formed with two layers including a first conductive layer and a second conductive layer.

4. The method of forming a mounted structure according to claim 1, wherein:
   the electrode further comprises a plurality of electrodes;
   the resin convexity further comprises a series of resin convexities on the plurality of electrodes, the resin convexities being adjacent to each other;
   a conductive unit is on a surface of each of the resin convexities such that each conductive unit corresponds to an electrode of the plurality of electrodes.

* * * * *